US006957005B2

(12) United States Patent
Saulnier et al.

(10) Patent No.: US 6,957,005 B2
(45) Date of Patent: Oct. 18, 2005

(54) POGO CONTACTOR ASSEMBLY FOR TESTING OF AND/OR OTHER OPERATIONS ON CERAMIC SURFACE MOUNT DEVICES AND OTHER ELECTRONIC COMPONENTS

(75) Inventors: Christian R. Saulnier, Boutigny (FR); James G. Gasque, Vista, CA (US); Manuel A. Gallardo, Carnetin (FR)

(73) Assignee: Ceramic Component Technologies, Inc., Vista, CA (US)

( * ) Notice: Subject to any disclaimer, the term of this patent is extended or adjusted under 35 U.S.C. 154(b) by 128 days.

(21) Appl. No.: 10/198,692

(22) Filed: Jul. 16, 2002

(65) Prior Publication Data

US 2004/0013396 A1    Jan. 22, 2004

(51) Int. Cl.[7] .......................... G01B 9/00; G01R 31/02
(52) U.S. Cl. ...................... 385/137; 385/147; 324/757; 324/758
(58) Field of Search .................. 385/134–135, 385/137, 147; 324/754–758

(56) References Cited

U.S. PATENT DOCUMENTS

| | | | | |
|---|---|---|---|---|
| 5,253,316 A | * | 10/1993 | Shibutani et al. | 385/78 |
| 5,451,883 A | * | 9/1995 | Staab | 324/758 |
| 2001/0039128 A1 | * | 11/2001 | Tateishi et al. | 439/71 |

* cited by examiner

Primary Examiner—Akm Enayet Ullah
Assistant Examiner—Jerry T. Rahll
(74) Attorney, Agent, or Firm—Loyal McKinley Hanson

(57) ABSTRACT

A contactor assembly useable on a component testing system for electrically contacting a terminal on a device under test (DUT) for parametric testing and eventual sorting as part of component batch processing includes a holder subassembly and a tip subassembly. The holder subassembly includes a housing and spring-biasing components within the housing. The housing has a proximal end portion for mounting on the component testing system and a distal end portion for holding the tip subassembly proximate the terminal of the device under test. The tip subassembly includes a blade-holding structure and at least one blade held by the blade-holding structure, and the contactor assembly includes components (i.e., a quick-release mechanism) for removably mounting the tip subassembly on the distal end portion of the housing with the spring-biasing components spring biasing the blade toward the terminal of the device under test. According to a separate aspect of the invention, the contactor assembly includes a passageway-defining structure that defines a passageway extending within the contactor assembly through which to perform a desired operation (e.g., vision operations, laser operations, light operations, air or gas flow operations, liquid operations, coaxial cable operations) on the device under test such as, for example, using an optical fiber in the passageway as part of a fiber optic positioning system.

10 Claims, 10 Drawing Sheets

POGO CONTACTOR ASSEMBLY FOR TESTING OF AND/OR OTHER OPERATIONS ON CERAMIC SURFACE MOUNT DEVICES AND OTHER ELECTRONIC COMPONENTS

BACKGROUND OF THE INVENTION

1. Technical Field

This invention relates generally to the testing of electronic devices, including circuit boards, semiconductors, and hybrids, in addition to the batch processing of miniature electronic circuit components, including passive, two-terminal, ceramic capacitors, resistors, inductors, and the like. More particularly, it concerns a contactor assembly for electrically contacting a terminal on any device under test (DUT), including, circuit boards, hybrids, semiconductors, and passive components, as part of the batch processing for purposes of parametric testing.

2. Description of Related Art

Continuous miniaturization and the resulting shrinking geometries found within semiconductors, hybrids, and circuit boards, in addition to the tiny size of electronic circuit components of interest herein, complicates processing. Features within semiconductors, hybrids, and circuit boards can be only a few microns in size, and in some cases, even sub-micron. Passive components are typically fabricated in parallelepiped shapes having dimensions as small as 0.020" by 0.010" by 0.010," more or less, these difficult-to-handle components require appropriate equipment and precision handling techniques. What is sometimes referred to as a "carrier plate" holds many hundreds of the components upright in spaced-apart positions as the ends of each component are coated with a conductive material to produce electrical terminals. After adding terminals, a "test plate" holds the large batch of components for movement past a contactor assembly of a testing system for parametric testing purposes and eventual sorting. Thoughtful design of each of these components promotes efficient processing. Reference may be made to U.S. Pat. Nos. 6,204,464; 6,294,747; 6,194,679; 6,069,480; 4,395,184; and 4,669,416 for examples of some prior art component handling systems and testing techniques.

The contactor assembly is of particular interest. It is a device having an electrical contact that touches the DUT terminal as the test plate or other handling device moves the DUT past the contactor assembly. It does so to complete an electrical testing circuit. One problem is that touching the DUT terminal improperly can physically damage the terminal. It can also produce a poor electrical contact that degrades test results. U.S. patent application Ser. No. 10/097,464 addresses those concerns with a multi-contact contactor assembly that can be implemented with sliding contacts, rolling contacts, or pogo pin contacts.

As mentioned in the above-identified patent application, the electrical and mechanical functions of the contactors are conflicting and this holds true for pogo pin contactors (or probes). The electrical function is to deliver the test signal to the terminal of a DUT so that an accurate test can be performed. The mechanical function is to push a contact against the DUT terminal with enough force to break through any non-conductive surface layer on the DUT terminal so that a low resistance contact can be achieved, thus enabling an accurate test. Breaking through the non-conductive layer can leave a scratch, indentation, or other mark which may be considered a defect by the end user of the DUT. On the other hand, not breaking through the non-conductive layer may prevent a good contact (low serial resistance) and result in an inaccurate test result.

The electrical and mechanical functions in typical existing pogo probes are closely integrated and cannot be separated. There are several reasons for this. First, the pogo spring resides within the probe itself. This automatically limits the size, shape, and length of the spring that can be used and it usually means that the spring is very small and therefore rather fragile. In fact, one of the main failure modes for existing pogo probes is the spring breaking during use.

Second, the spring inside the pogo probe is a compression spring, that is, it is designed to be compressed in normal use. When one looks at a compression spring when it is in the relaxed (non-compressed) state, it looks very much like, and is, an air wound inductor. Having an inductor inside the probe can introduce uncontrolled stray impedances for which the user cannot compensate. Many elaborate designs have been introduced to reduce this undesired characteristic.

Third, most existing pogo probes do not allow for a Kelvin circuit within the contact. A common technique is to use two probes, one for drive and one for sense, thus doubling the number of probes to be used, maintained, cleaned, aligned, and so forth. Since these probes do not allow for Kelvin testing, the contact tips must break through any non-conductive layer to achieve a low resistance contact to the DUT terminal. Many existing probes have pointed or spear shaped tips for this purpose. Such tips can easily cause damage to the DUT terminal.

In addition, since typical existing pogo probe designs tightly integrate the mechanical and electrical functions, there is no way to quickly change the probe tip without changing the entire probe assembly. That fact introduces costs and inconvenience.

Furthermore, discreet devices, circuit boards, hybrid assemblies, semiconductors, and so forth are constantly evolving into more miniaturized configurations. As they become smaller, the geometry of the individual elements within the devices become smaller, resulting in a requirement to locate and place a test contact with more precision and repeatability. Careful design of the contactor assembly and the test plate help control positioning of the contactor assembly relative to the DUT terminal, but existing positioning techniques need improvement.

SUMMARY OF THE INVENTION

This invention addresses the concerns outlined above by providing a pogo contactor assembly having a holder assembly that holds the spring-biasing components and a removable tip subassembly on the holder subassembly that holds one or more blades. That arrangement facilitates tip replacement without affecting the spring-biasing components (and other components) of the holder subassembly and it contributes various related advantages described later on. According to a separate aspect of the invention, the contactor assembly includes a passageway-defining structure that defines a passageway through it in which to place an optical fiber as part of a fiber optic positioning system. The optical fiber communicates position-related feedback information and the resulting closed-loop positioning system can achieve far more accurate contactor positioning relative to a DUT terminal. The passageway also enables other operations on a DUT through the contactor assembly as described later on.

To paraphrase some of the more precise language appearing in the claims, a contactor assembly constructed according to the invention for connecting a component testing system to a DUT terminal, includes a holder subassembly and a tip subassembly. The holder subassembly includes a housing and spring-biasing components within the housing, and the housing has a proximal end portion for mounting on the component testing system and a distal end portion for holding the tip subassembly proximate the DUT terminal. The tip subassembly includes a blade-holding structure (i.e., a tip) and at least one blade held by the blade-holding structure. The contactor assembly includes means for removably mounting the tip subassembly on the distal end portion of the housing, with the spring-biasing components spring biasing the blade toward the terminal of the device under test. Preferably, the means for removably mounting the tip subassembly on the distal end portion of the housing includes a quick-release mechanism that is adapted for movement axially between a locked position in which the tip subassembly is locked onto the distal end portion of the housing and an unlocked position in which the tip subassembly is unlocked and free to be removed from the distal end portion of the housing. One embodiment includes a plurality of converging blades while another embodiment includes a plurality of diverging blades. A contactor assembly constructed according to a separate aspect of the invention includes a passageway-defining structure that defines a passageway through it (e.g., a hollow tube) that can be used to perform a desired operation on the DUT (e.g., fiber optic positioning using an optical fiber in the passageway).

Thus, the invention effectively separates the electrical and mechanical functions to alleviate many problems of existing contactor assemblies. It is designed in two parts—a holder subassembly which contains the springs and a tip subassembly which contains the blades. The tip subassembly is easily removable for repair or replacement. If a blade is damaged, replacement is quick and precise.

The tip subassembly can have eight blades, for example, giving the contactor assembly multi-point characteristics that reduce stray serial impedances, as explained in U.S. patent application Ser. No. 10/097,164. The multiple blades also enable the multiple redundant Kelvin circuits within one contactor assembly. Such multiple redundant Kelvin test circuits have several benefits. Eight independently biased blades contacting a DUT terminal insures at least one good Kelvin contact because independent biasing allows the blades to conform to irregularities in the surface topography of the DUT terminal. In addition, certain one of the blades can be connected to different test signals and/or voltages (e.g., a guard connection). Furthermore, the combination of multi-point contacting and Kelvin circuits means that the do not have to push against the DUT terminal with enough force to completely break through any non-conductive surface layer in order to make an accurate test, thereby greatly reducing the probability of damaging the DUT terminal.

The holder subassembly is designed to accomplish the mechanical function of the contactor assembly. It holds the springs and means to connect test signals from the test instrument to the tip subassembly. It includes a quick-release mechanism for quick and convenient mounting and removal of the tip subassembly. The quick-release mechanism is designed to hold the tip subassembly in a mechanically precise and stable manner, which is necessary for many difficult measurements.

While the tip subassembly must typically fit into small areas, generally no such limitation applies to the holder subassembly. Therefore, it is possible to make a holder subassembly that is quite large in relation to the tip subassembly without interfering with required clearances near the DUT. This also means that the springs which bias the blade tips against the DUT do not have to fit within small spaces in the tip subassembly. They can be longer and more robust with bigger diameters and so forth. The advantage is that the springs can be designed for correct mechanical characteristics and longer life because they do not have to fit within the very small spaces available within typical existing pogo contactor designs.

Referring to the problem of the compression spring acting as an air wound inductor, the holder subassembly provides a solution. The spring is completely encased in a conductive sleeve, and shorted at each end of the sleeve by internal electrical contacts. There is little possibility that stray inductance can be introduced with this system.

Concerning the fiber optic aspects of the invention, there is a central tube which is precisely positioned along the longitudinal axis of the contactor assembly, extending through the holder subassembly and partially through the tip subassembly. It may be terminated with a small lens. An optical fiber is introduced into this tube so that it extends down to the lens. The optical fiber connects to suitable fiber optic interfacing and control components (e.g., a camera and vision computer) to allow precise positioning of the contactor assembly. Using feedback from the vision computer, it is possible to contact target areas as small as a few microns, accurately and repeatably. The tube may also be used for vision operations, laser operations, light operations, air/gas/vacuum flow operations, liquid operations, mechanical operations, and even as part of a coaxial cable signal line.

As for the blades, typically existing pogo probe designs have the mechanical and electrical functions tightly integrated with the result that there is no way to quickly change blades without replacing the entire contactor assembly. The removable tip subassembly of the invention enables quick, convenient blade replacement without effecting the holder subassembly, and the replacement blades may have an entirely different design and function than the blades they replace. In other words, it is possible to change the desired application of the contactor assembly just by changing the tip subassembly, not the entire contactor assembly. Converging blades are useful, for example, for contacting a single point or DUT terminal. Diverging blades enable contact of both ends of a two terminal device with redundant Kelvin circuits. Other blade shapes, arrangements, and Kelvin circuits can be readily implemented and used with the removable tip subassembly. One contactor assembly can replace two or more typical existing pogo probes. Among other things, that means lower part count for a given test application and less maintenance. The following illustrative drawings and detailed description make the foregoing and other objects, features, and advantages of the invention more apparent.

DESCRIPTION OF THE PREFERRED EMBODIMENTS

Figure 1:
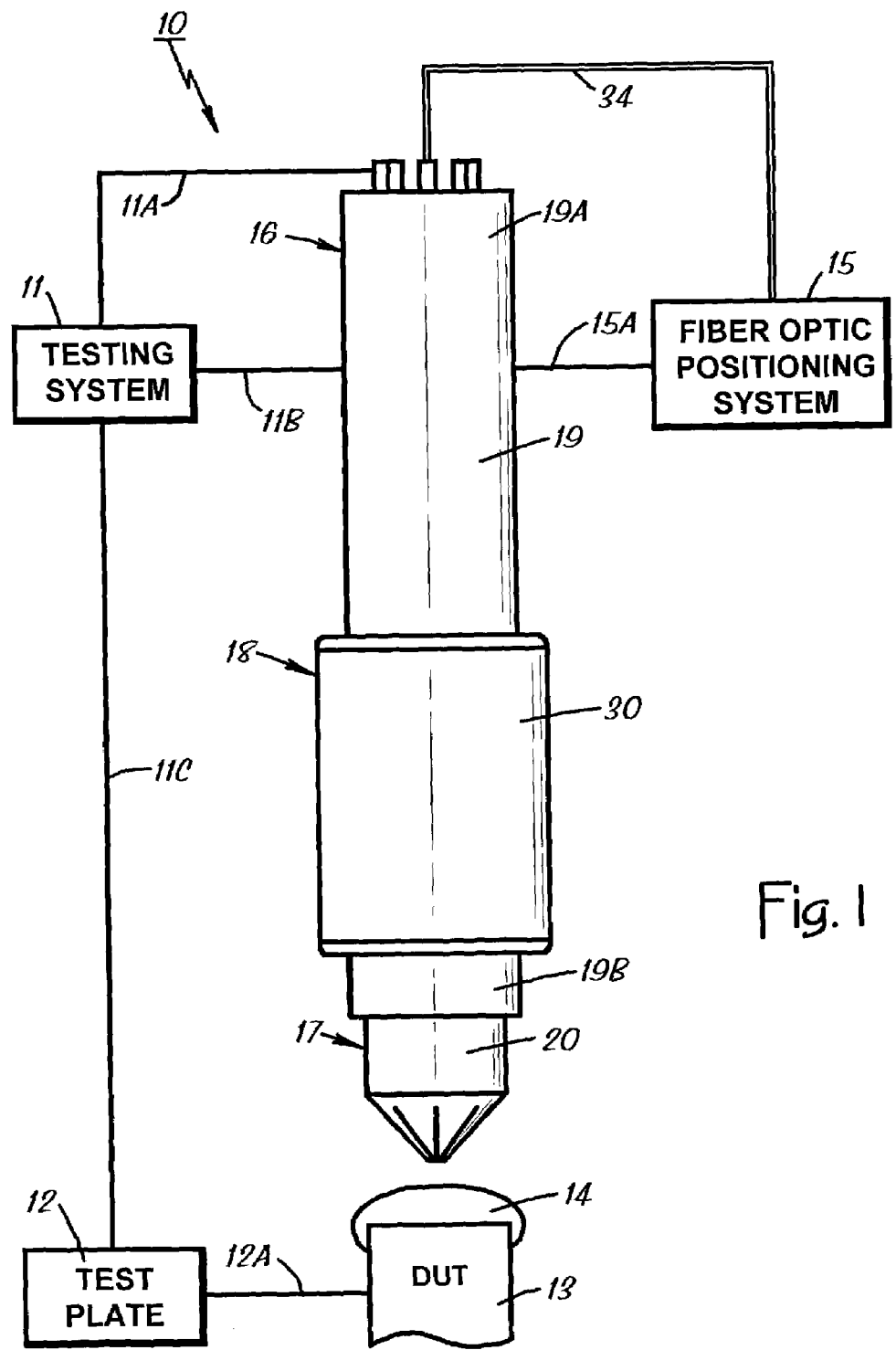
FIG. 1 of the drawings is an elevation view of a contactor assembly constructed according to the invention that is connected as part of a component testing system with fiber optic positioning which is illustrated diagrammatically.

FIGS. 1–7 of the drawings show various aspects of a contactor assembly 10 constructed according to the invention. It is shown in FIG. 1 in its typical environment, mounted on a component testing system 11 that is depicted diagrammatically. The testing system 11 is coupled to the contactor assembly 10 electrically, as represented in FIG. 1 by a signal line 11A, and mechanically as represented by a line 11B. The testing system 11 holds a test plate 12 as represented by a line 11C, and the test plate 12 holds a DUT 13 as represented by a line 12A. The contactor assembly 10 couples test signals between the testing system 11 and a DUT terminal 14 on the DUT 13, while a fiber optic positioning system 15 precisely positions the contactor assembly 10 relative to the DUT terminal 14 as represented by a line 15A. United States patent application having Ser. No. 10/097,464 provides some related information about contactor assemblies used with component testing systems, and that patent application is incorporated herein for the information provided.

Figures 2, 3:
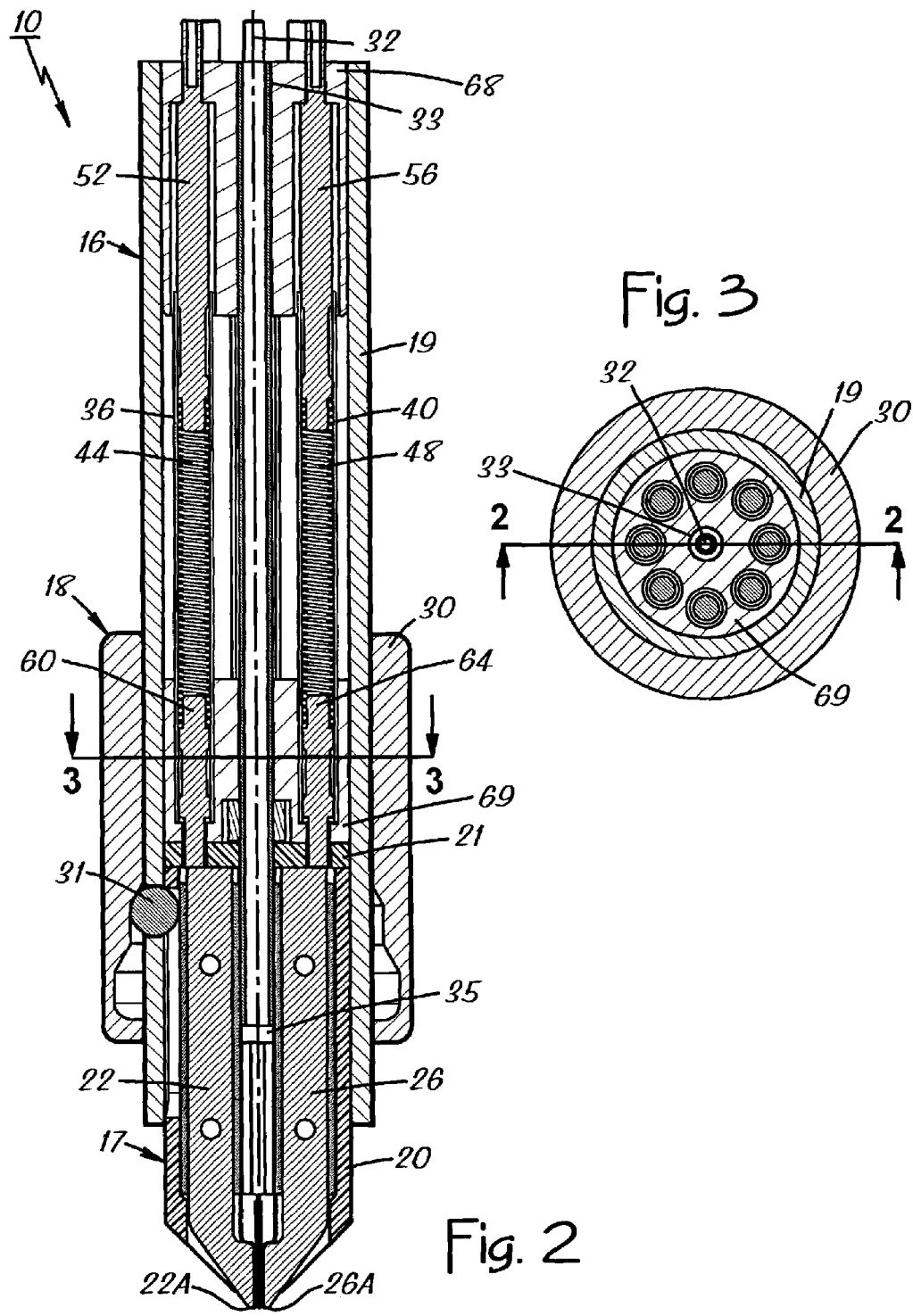
FIG. 2 is a cross sectional elevation view of the contactor assembly as viewed in a vertical bisecting plane through the contactor assembly that contains a line 2—2 in FIG. 3.
FIG. 3 is a cross sectional plan view of the contactor assembly as viewed in a horizontal plane through the contactor assembly that contains a line 3—3 in FIG. 2.
Figure 4:
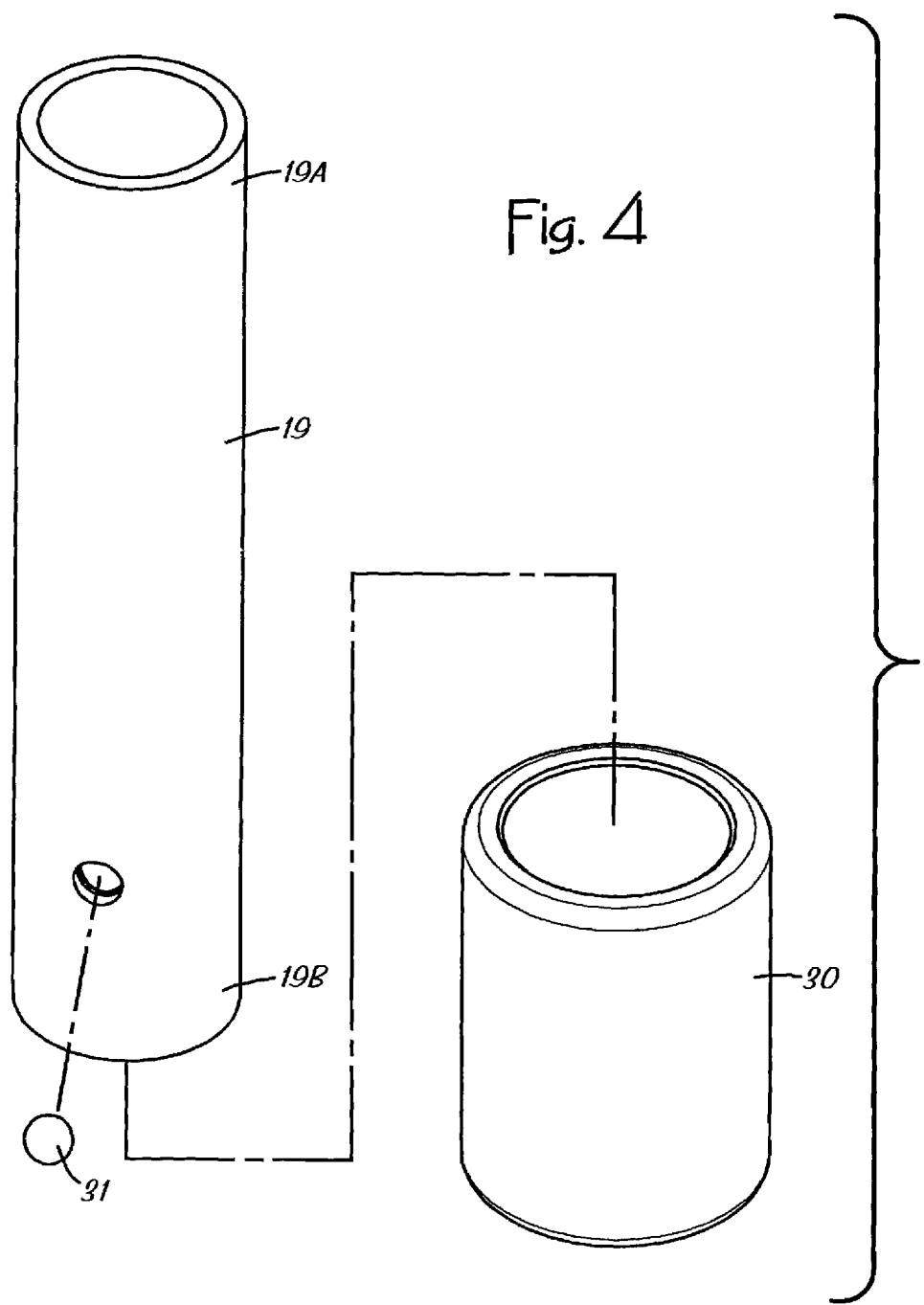
FIG. 4 is an exploded view (not to scale) of the housing of the holder subassembly, including the sleeve and locking ball of the quick-release mechanism of the contactor assembly.

Generally, the contactor assembly 10 includes a holder subassembly 16, a tip subassembly 17, and a quick-release mechanism 18 (FIGS. 1 and 2). The holder assembly 16 includes a housing 19 (FIGS. 1, 2, 3, and 4) that holds various spring-biasing and related components illustrated in FIGS. 4, 5, and 6. The housing 19 has proximal and distal end portions 19A and 19B. The housing 19 mounts on the component testing system 11, while the distal end portion 19B holds the tip subassembly 17 proximate the DUT terminal 14.

Figure 7:
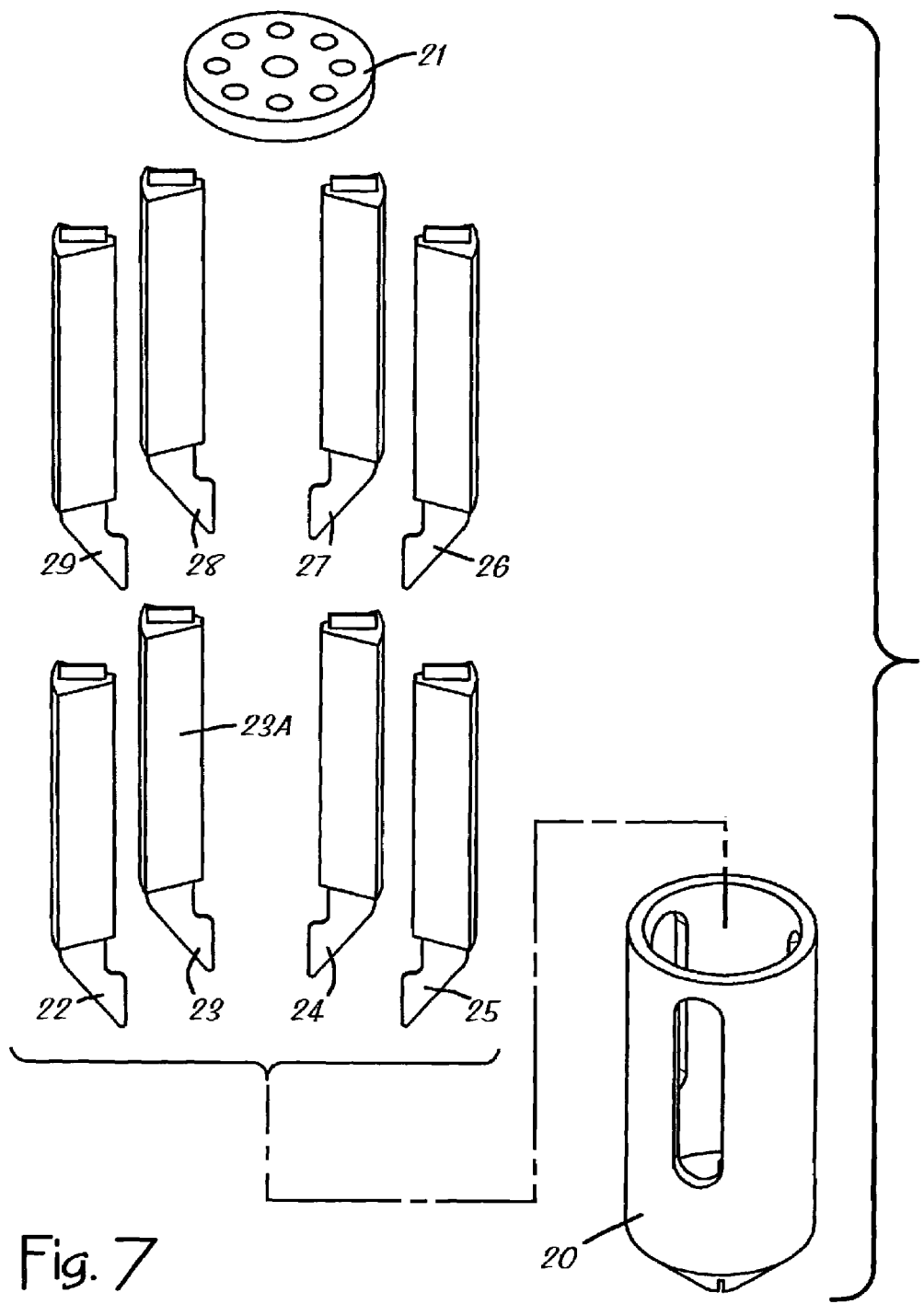
FIG. 7 is an exploded view (not to scale) of the tip subassembly of the contactor assembly, including the eight converging blades, the cap, and the blade-holding tip of the contactor assembly.

The tip subassembly 17 includes an electrically non-conductive tip 20 (FIGS. 1, 2, and 7) and an electrically non-conductive cap 21 (FIGS. 2 and 7) that hold eight contact blades 22–29 (two visible in FIG. 2 and eight visible in FIG. 7). Electrically non-conductive material on the blades 22–29 (e.g., plastic insulating sleeve 23A on the blade 23 in FIG. 7) isolates the blades 22–29 from each other electrically. The tip subassembly 17 is mounted on the holder subassembly 16 removably, with a sleeve 30 (FIGS. 1, 2, 3, and 4) and locking ball 31 (FIGS. 2 and 4) of the quick-release mechanism 18 securing the tip subassembly 17 on the holder subassembly 16 while enabling quick, convenient removal.

The housing 19, the tip 20, and the sleeve 30 are disposed coaxially relative to a central longitudinal axis 32 of the contactor assembly 10 that is identified in FIG. 2. The sleeve 30 is illustrated in is FIGS. 1 and 2 in a forward position (i.e., a distal position). This is the locked position of the sleeve 18 in which the sleeve 18, the locking ball 31, the housing 19, and the tip 20 cooperate to secure the tip subassembly 17 on the holder subassembly 16. Manually sliding the sleeve 30 axially away from the distal end portion 19B of the housing 19 to a rearward position (i.e., a proximal position) allows the locking ball 31 to disengage the tip 20 so that the tip subassembly 17 can be removed from the holder subassembly 16. This is the unlocked position of the sleeve 18.

Figure 5:
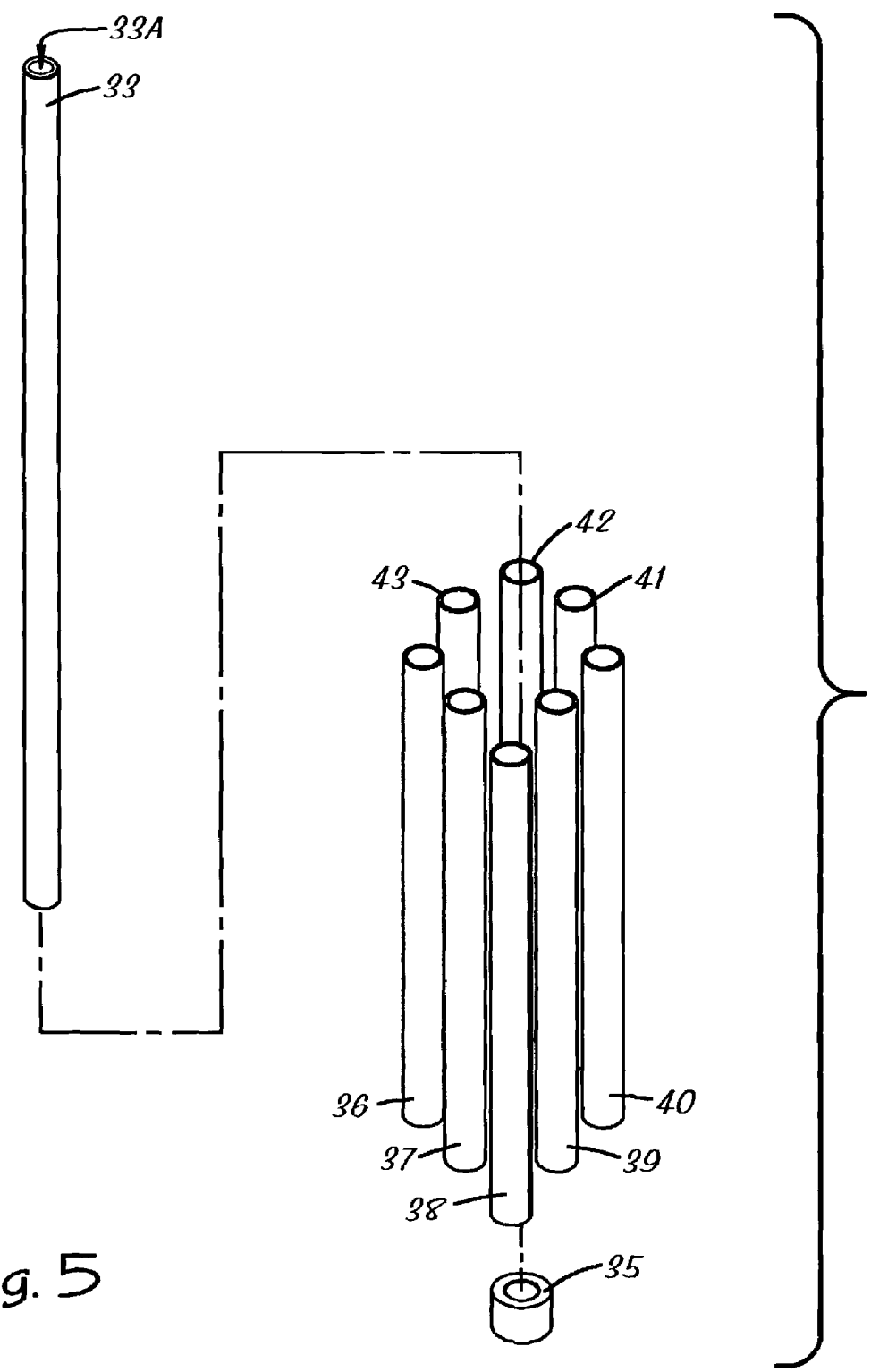
FIG. 5 is an exploded view (not to scale) of the central tube, the spring-containing tubes, and the lens component of the contactor assembly.
Figure 6:
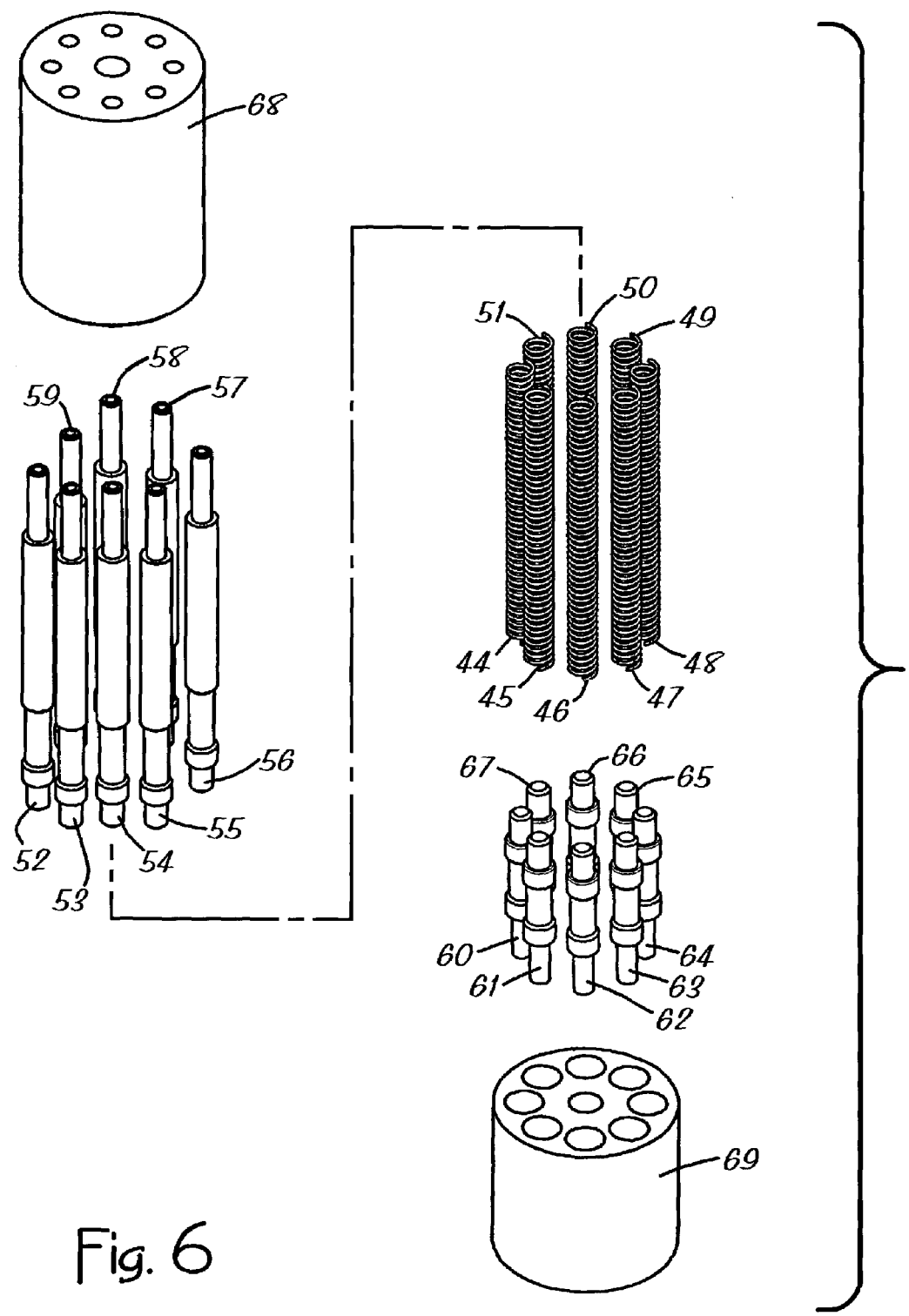
FIG. 6 is an exploded view (not to scale) of the spring-biasing components of the contactor assembly, including the connectors, the springs, and the alignment blocks.

According to another aspect of the invention, the contactor assembly 10 includes a passageway-defining structure that defines a passageway extending though the contactor assembly 10. It enables a desired operation to be performed through the passageway. The contactor assembly 10 includes a hollow tube 33 for that purpose (FIGS. 2, 3, and 5). It is disposed coaxially relative to the central axis 32 and it defines a passageway 33A (FIG. 5) in which to receive an optical fiber 34, for example, that connects to the fiber optic positioning system 15 shown in FIG. 1. The optical fiber 34 cooperates with a lens assembly 35 (FIGS. 2, and 5) to acquire position information and communicate it to the fiber optic positioning system 15. Of course, a lens may be omitted for some applications. The provision of a passageway-defining structure enables other desired operations referred to generally herein as vision operations, laser operations, light operations, air/gas/vacuum flow operations, liquid operations, mechanical operations, and even as part of a coaxial cable signal line.

Surrounding the tube 33 within the housing 19 at circumferentially spaced-apart intervals are eight electrically conductive sleeves 36 through 43. Just the two sleeves 36 and 40 are visible and identified in FIG. 2, while all of the sleeves 36–43 are visible and identified in FIG. 5. The sleeves 36–43 hold spring-biasing components in the form of eight electrically conductive springs 44 through 51 that function as means for spring biasing the blades 22–29 distally, toward the DUT terminal 14. Just the two springs 44 and 48 are visible and identified in FIG. 2, while all the springs 44–51 are visible and identified in FIG. 6.

Eight electrically conductive terminals 52 through 59 combine with the sleeves 36–43, the springs 44–51, and eight electrically conductive push rods 60 through 67 to couple electrical signals to the blades 22–29. Just the two terminals 52 and 56 and the two push rods 60 and 64 are visible and identified in FIG. 2, while all the terminals 52–59 and all the push rods 60–67 are visible and identified in FIG.

6. An electrically non-conductive upper alignment block 68 and an electrically non-conductive lower alignment block 69 (FIGS. 2 and 6) help secure the other components in proper alignment within the housing 19.

As an idea of size, the illustrated contactor assembly 10 is about eight centimeters in overall length and the quick release sleeve 30 part of it is about two centimeters in diameter. Of course, the size may vary considerably depending on the precise application. Based upon the foregoing and subsequent descriptions, one of ordinary skill in the art can readily implement the invention in any of various sizes and shapes for any of various operations.

Figure 8:
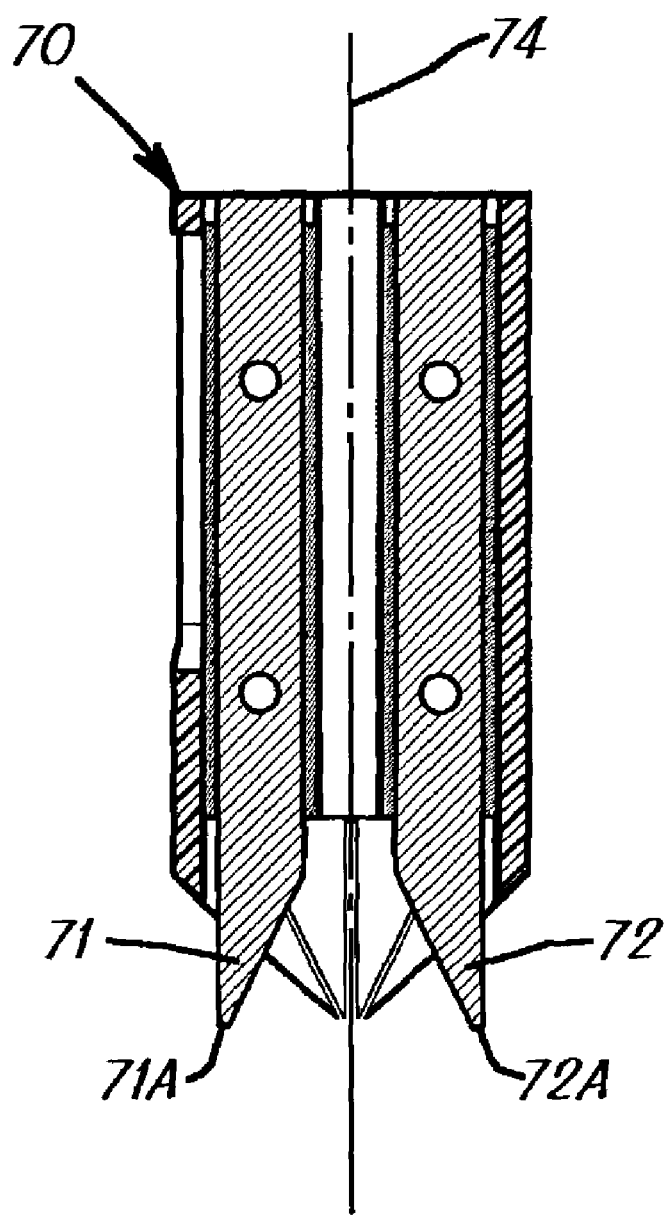
FIG. 8 is a cross sectional view of a tip similar to the tip in FIG. 2 that has diverging blades.

FIG. 8 illustrates another embodiment of a tip assembly 70 constructed according to the invention. The tip assembly 70 is generally similar to the tip assembly 17. It is illustrated with two blades 71 and 72. The major difference is that the blades 71 and 72 are diverging. In other words, the blades 22–29 of the tip assembly 17 are so shaped and positioned in the tip assembly 17 that the distal ends of the blades 22–29 (e.g., distal ends 22A and 26A in FIG. 2) converge toward the central axis 32 (i.e., they are closely spaced to each other so that they are in close proximity to the central axis). The blades 71 and 72, however, are so shaped and positioned in the tip assembly 70 that the distal ends 71A and 72A of the blades 71 and 72 diverge from the central axis 74 in FIG. 8 (they are spread apart from each other so that they are spaced apart from the central axis). The ability to use different blade sizes and shapes by exchanging tips significantly increases contactor functionality.

FIGS. 9–14 illustrate the contactor assembly 10 in various systems for performing desired operations via the contactor assembly 10. Although the various systems are illustrated using the contactor assembly 10, the techniques disclosed apply to any contactor assembly, whether sliding-type, roller-type, pogo-type, or otherwise. Also, while the contactor assembly 10 has a central tube 33, the techniques disclosed apply equally well to other types of multi-point contactors with different design features (e.g., a passageway in the form of a simple aperture which is not necessarily located in a central position).

A more general way to view the use of the central tube 33 described previously is to view it as "vision operations," which may be through an optical fiber or directly through the tube 33, with or without a lens. Another operation is illustrated by the system 100 in FIG. 9. It includes a fiber optics interface 101 and a laser operations control system 102 that combine with the contactor assembly 10 to perform laser operations through an optical fiber in the tube 33. An example of its use is to contact a DUT and then use a laser beam through the central tube 33 to trim the value of the DUT (i.e., laser machining so to speak).

Figure 10:
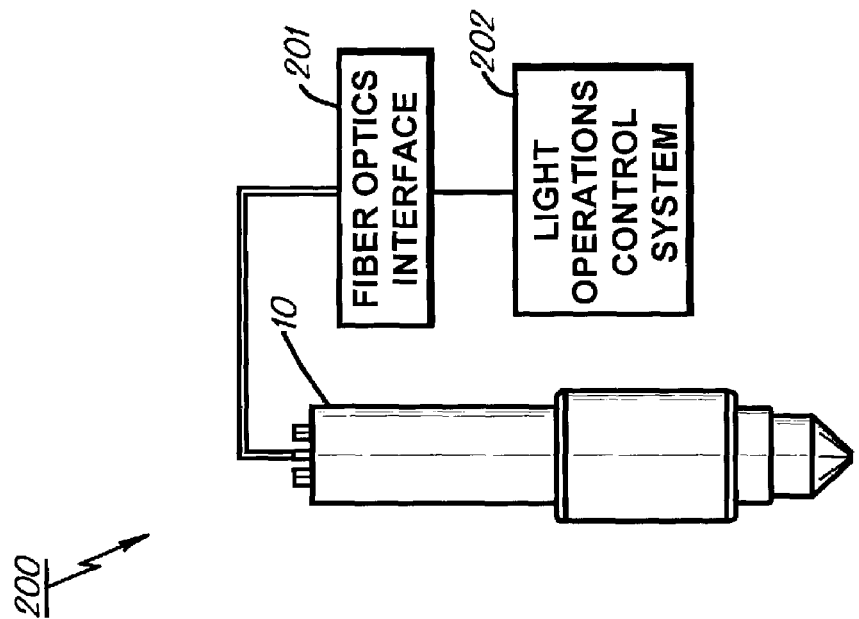
FIG. 10 is a diagrammatic representation of a third system that includes a contactor assembly constructed according to the invention for light operations with an optical fiber through the central tube of the contactor assembly.
Figure 9:
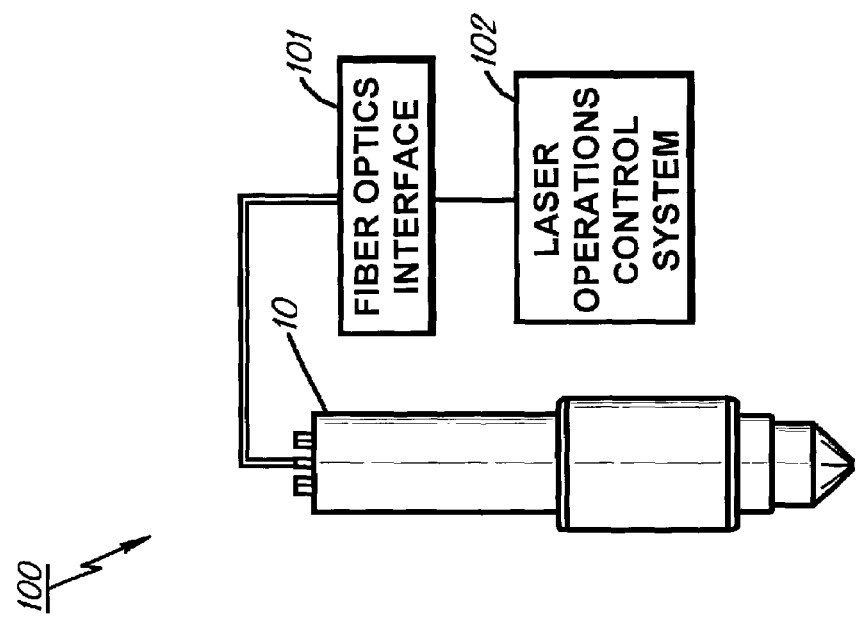
FIG. 9 is a diagrammatic representation of a second system that includes a contactor assembly constructed according to the invention for laser machining operations with an optical fiber through the central tube of the contactor assembly.

FIG. 10 illustrates light operations through an optical fiber with a system 200 that includes a fiber optics interface 201 and a light operations control system 202. Although FIG. 10 illustrates such light operations through an optical fiber, light operations may be done through the tube 33 without an optical fiber and with or without a lens. Visible light beamed through the tube 33, for example, is used to illuminate the DUT so that a vision camera has adequate light to see the DUT and move the contact to a precise location. This may be though of as the reverse of vision operations. In vision operations, the DUT is illuminated by an external light source, and the vision camera looks through the tube 33. In light operations, the vision camera observes the DUT from a position external to the contactor assembly 10 while the light to illuminate the DUT passes through the tube 33.

Figure 11:
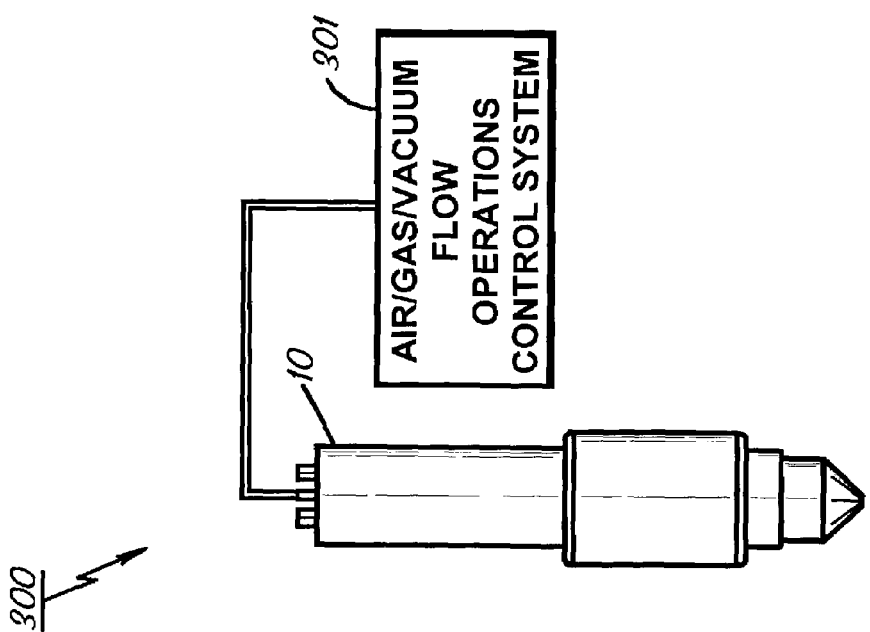
FIG. 11 is a diagrammatic representation of a fourth system that includes a contactor assembly constructed according to the invention for air or gas flow operations through the central tube of the contactor assembly.
Figure 14:
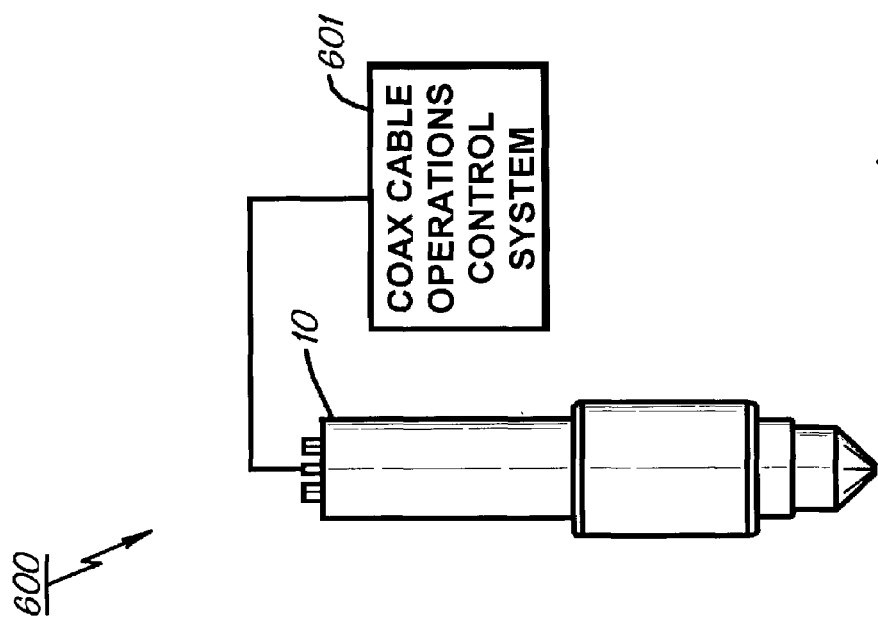
FIG. 14 is a diagrammatic representation of a seventh system that includes a contactor assembly constructed according to the invention for electrical testing using the central tube of the contactor assembly as part of a coaxial cable.
Figure 13:
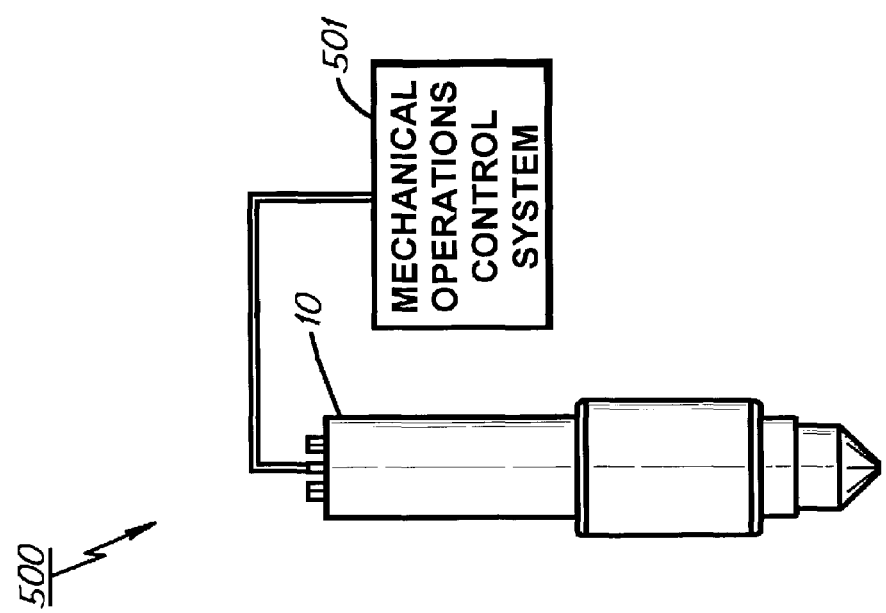
FIG. 13 is a diagrammatic representation of a sixth system that includes a contactor assembly constructed according to the invention for mechanical operations through the central tube of the contactor assembly.

The system 300 in FIG. 11 includes an air/gas/vacuum flow operations control system 301. Air or some other gas is forced through the tube 33 to clean or cool the DUT. Alternatively, a vacuum can be applied through the tube 33 to pick up a loose DUT and hold it against the blades 22–29 for testing. Then, while continuing to hold the DUT, it is moved after testing and deposited in a desired location.

Figure 12:
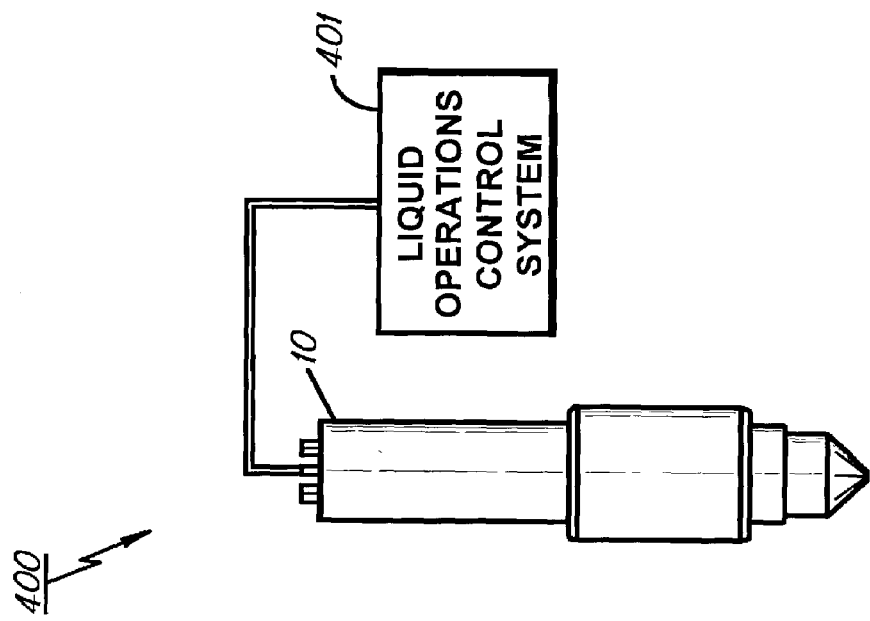
FIG. 12 is a diagrammatic representation of a fifth system that includes a contactor assembly constructed according to the invention for liquid operations through the central tube of the contactor assembly.

The system 400 in FIG. 12 includes a liquid operations control system 401 that passes a liquid through the tube 33 to clean or cool the DUT. The system 500 in FIG. 13 includes a mechanical operations control system 501. Punching, marking or scribing, and/or other desired mechanical operations on a DUT are done through the tube 33. A DUT that does not pass an electrical test, for example, is mechanically marked so that it is positively identified as defective. The system 600 in FIG. 14 includes a coax cable operations control system 601 (e.g., part of the component testing system). It applies a test signal through the tube 33, so that the tube 33 functions as part of a coaxial cable. The blades 22–29 serve as a shield. Coaxial contacts are very useful for higher frequency measurement applications.

Thus, the invention provides a contactor assembly having significantly increased functionality. It is designed in two parts—a holder subassembly which contains the springs and a tip subassembly which contains the blades. The tip subassembly is easily removable for repair or replacement. If a blade is damaged, replacement is quick and precise. Various blade configurations can be conveniently interchanged. In addition, the contactor assembly defines a passageway that enables a desired operation to be performed through the contactor assembly. Although exemplary embodiments have been shown and described, one of ordinary skill in the art may make many changes, modifications, and substitutions without necessarily departing from the spirit and scope of the invention.

What is claimed is:

1. A contactor assembly for connecting a component testing system to a terminal on a device under test, the contactor assembly comprising:
    a holder subassembly; and
    a tip subassembly;
    the holder subassembly including a housing and spring-biasing components within the housing;
    the housing having a proximal end portion for mounting on the component testing system and a distal end portion for holding the tip subassembly proximate the terminal of the device under test;
    the tip subassembly including a blade-holding structure and at least one blade held by the blade-holding structure; and
    the contactor assembly including means for removably mounting the tip subassembly on the distal end portion of the housing with the spring-biasing components spring biasing the blade toward the terminal of the device under test.

2. A contactor assembly as recited in claim 1, wherein the means for removably mounting the tip subassembly on the distal end portion of the housing includes a quick-release sleeve disposed coaxially over the distal end portion of the housing that is adapted for movement axially between a locked position in which the tip subassembly is locked onto the distal end portion of the housing and an unlocked position in which the tip subassembly is unlocked and free to be removed from the distal end portion of the housing.

3. A contactor assembly as recited in claim 1, further comprising a plurality of blades held by the blade-holding structure.

4. A contactor assembly as recited in claim 1, further comprising means within the housing for electrically connecting the blade to the component testing system.

5. A contactor assembly as recited in claim 1, further comprising a plurality of elongated blades held by the blade-holding structure, each blade having a tip and the plurality of blades being so arranged within the blade-holding structure that the tips of the blades converge.

6. A contactor assembly as recited in claim 1, further comprising a plurality of elongated blades held by the blade-holding structure, each blade having a tip and the plurality of blades being so arranged within the blade-holding structure that the tips of the blades diverge.

7. A contactor assembly as recited in claim 1, further comprising a passageway-defining structure that defines a passageway extending within the contactor assembly between the proximal and distal end portions of the housing through which to perform a desired operation on the device under test.

8. A contactor assembly as recited in claim 7, wherein the passageway-defining structure includes a hollow tube extending within the housing between the proximal and distal end portions.

9. A contactor assembly as recited in claim 7, further comprising an optical fiber within the passageway.

10. A contactor assembly as recited in claim 9, further comprising a lens located distally of the optical fiber.

* * * * *